(12) United States Patent
Ha et al.

(10) Patent No.: US 7,141,438 B2
(45) Date of Patent: Nov. 28, 2006

(54) MAGNETIC TUNNEL JUNCTION STRUCTURE HAVING AN OXIDIZED BUFFER LAYER AND METHOD OF FABRICATING THE SAME

(75) Inventors: Young-Ki Ha, Gyeonggi-do (KR); Jang-Eun Lee, Gyeonggi-do (KR); Hyun-Jo Kim, Gyeonggi-do (KR); Se-Chung Oh, Daejeon (KR); Jun-Soo Bae, Gyeonggi-do (KR); In-Gyu Baek, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 47 days.

(21) Appl. No.: 10/915,872

(22) Filed: Aug. 10, 2004

(65) Prior Publication Data

US 2005/0035386 A1  Feb. 17, 2005

(30) Foreign Application Priority Data

Aug. 11, 2003  (KR) .................... 10-2003-0055559

(51) Int. Cl.
*H01L 21/00* (2006.01)
(52) U.S. Cl. ............................... 438/3; 438/2
(58) Field of Classification Search .................. 438/3, 438/295
See application file for complete search history.

(56) References Cited

U.S. PATENT DOCUMENTS 6,165,803 A   12/2000  Chen et al.
6,485,989 B1  11/2002  Signorini
6,939,722 B1*  9/2005  Okazawa et al. ............. 438/3

\* cited by examiner

*Primary Examiner*—Michael Lebentritt
*Assistant Examiner*—Elias M. Ullah
(74) *Attorney, Agent, or Firm*—Marger Johnson & McCollom, P.C.

(57) ABSTRACT

There are provided a magnetic tunnel junction structure and a method of fabricating the same. The magnetic tunnel junction structure includes a lower electrode, a lower magnetic layer pattern and a tunnel layer pattern, which are sequentially formed on the lower electrode. The magnetic tunnel junction structure further includes an upper magnetic layer pattern, a buffer layer pattern, and an upper electrode, which are sequentially formed on a portion of the tunnel layer pattern. The sidewall of the upper magnetic layer pattern is surrounded by an oxidized upper magnetic layer, and the sidewall of the buffer layer pattern is surrounded by an oxidized buffer layer. The depletion of the upper magnetic layer pattern and the lower magnetic layer pattern in the magnetic tunnel junction region can be prevented by the oxidized buffer layer.

16 Claims, 5 Drawing Sheets

MAGNETIC TUNNEL JUNCTION STRUCTURE HAVING AN OXIDIZED BUFFER LAYER AND METHOD OF FABRICATING THE SAME

CROSS-REFERENCE TO RELATED APPLICATION

This application claims priority from Korean Patent Application No. 2003-55559, filed on Aug. 11, 2003, the disclosure of which is hereby incorporated herein by reference in its entirety.

BACKGROUND OF THE INVENTION

1. Field of the Invention

The present invention relates to a magnetic tunnel junction structure and a method of fabricating the same, and more particularly, to a magnetic tunnel junction structure having an oxidized buffer layer, and a method of fabricating the same.

2. Description of the Related Art

Semiconductor memory devices for storing information are normally classified into volatile memory devices and non-volatile memory devices. Whereas the volatile memory devices lose stored information therein when a power supply is shut off, the non-volatile memory devices still keep stored information even when a power supply is shut off. Such non-volatile memory devices including flash memory devices, ferroelectric random access memory (FeRAM) devices, and magnetic random access memory (MRAM) devices are typically used in memory cards, mobile phone communication terminals, and other electronics products in order to keep stored information therein, and to reduce power consumption.

The MRAM device includes a plurality of memory cells employing magnetic tunnel junction (MTJ) structures. The MTJ structure includes a lower magnetic layer pattern, a tunnel layer pattern and an upper magnetic layer pattern, which are stacked on a lower electrode. In accordance with the magnetization direction of the lower magnetic layer pattern and the upper magnetic layer pattern, there occurs a difference in the current amount flowing through the tunnel layer pattern. The MRAM device stores information by changing the magnetization direction or using the difference of the lower magnetic layer pattern and the upper magnetic layer pattern.

Conventionally, such an MTJ structure is fabricated by sequentially forming a lower conductive layer, a lower magnetic layer, a tunnel layer, an upper magnetic layer and an upper conductive layer on a semiconductor substrate, and then, sequentially patterning them using an photolithography and etching technique to form a lower electrode, a lower magnetic layer pattern, a tunnel layer pattern, an upper magnetic layer pattern and an upper electrode.

However, while sequentially etching the upper magnetic layer and the lower magnetic layer, etch residues may occur and cause a short circuit between the upper magnetic layer and the lower magnetic layer. Said short circuit results in a device failure in an MRAM device and must be avoided.

A method for avoiding a short circuit between the upper magnetic layer and the lower magnetic layer due to etch residues is taught by Chen et al. in U.S. Pat. No. 6,165,803 in the title of "MAGNETIC RANDOM ACCESS MEMORY AND FABRICATING METHOD THEREOF", and taught by Signorini in U.S. Pat. No. 6,485,989 in the title of "MRAM SENSE LAYER ISOLATION". However, the method disclosed in the U.S. Pat. No. 6,485,989 causes a reduction in etch process margin because the tunnel layer becomes thinner because the upper magnetic layer should be etched such that the etching stops on the tunnel layer.

The method disclosed in the U.S. Pat. No. 6,165,803 includes etching an upper conductive layer (or mask layer), but the etching stops on an upper magnetic layer. Then, the exposed upper magnetic layer is changed into an insulating layer as will be described below.

FIGS. 1 to 3 are cross-sectional views illustrating a method of fabricating a magnetic tunnel junction structure in accordance with the U.S. Pat. No. 6,165,803.

Referring to FIG. 1, a lower insulating layer 13 is formed on a semiconductor substrate 11. A transistor (not shown) and a digit line (not shown) are formed on the semiconductor substrate 11. The lower insulating layer 13 insulates the digit line and the magnetic tunnel junction structure. In addition, the lower insulating layer 13 has a contact hole (not shown) and a plug (not shown) to electrically connect the magnetic tunnel junction structure and the transistor.

A lower conductive layer 15, a lower magnetic layer 17, a tunnel layer 19, an upper magnetic layer 21, and an upper conductive layer 23 are sequentially formed on the lower insulating layer 13.

Referring to FIG. 2, the upper conductive layer 23, the upper magnetic layer 21, the tunnel layer 19, the lower magnetic layer 17, and the lower conductive layer 15 are sequentially patterned to form a lower electrode 15a, a lower magnetic layer pattern 17a, a tunnel layer pattern 19a, a preliminary upper magnetic layer pattern 21a and an upper conductive layer pattern, which are sequentially stacked on the lower insulating layer 13.

Next, a new mask pattern is formed on the upper conductive layer pattern. The upper conductive layer pattern is then etched using the new mask pattern as an etch mask to form an upper electrode 23a. As a result, the upper surface of the preliminary upper magnetic layer pattern 21a is exposed.

Referring to FIG. 3, the exposed portion of the preliminary upper magnetic layer pattern 21a is oxidized or nitrified to form an inactive portion 21c. As a result, a final upper magnetic layer pattern 21b is formed in a magnetic tunnel junction region, while its sidewall is surrounded by the inactive portion 21c. Next, an upper insulating layer 25 is formed on the resulting structure having the final upper magnetic layer pattern 21b, and finally a bit line 27 is formed, to be electrically connected to the upper electrode 23a.

The method disclosed in the U.S. Pat. No. 6,165,803 decreases the likelihood of a short circuit between the final upper magnetic layer pattern 21b and the lower magnetic layer pattern 17a by using the technique of oxidizing or nitrifying the exposed portion of the preliminary upper magnetic layer pattern 21a.

However, this technique does have some limitations. The process for oxidizing the exposed preliminary upper magnetic layer pattern 21a must be performed at a low temperature to protect the final upper magnetic layer pattern 21b in the magnetic tunnel region. Therefore, this technique results in an undesirable and restrictive temperature requirement during the oxidation process.

Further, when forming the upper electrode 23a using a photolithography and etching technique, the photoresist pattern must be removed. In the removal process, an ashing technique using an $O_2$ plasma gas is used. However, ashing is performed at a relatively high temperature that may exceed the aforementioned temperature requirement and thus deteriorate the final upper magnetic layer pattern 21b.

Furthermore, to meet the temperature requirement, the upper insulating layer 25 must be formed using a low temperature process, typically lower than 300° C. However, it is difficult to adequately form the upper insulating layer with a desired high density while using this low temperature process because at the low temperature the upper insulating layer has a tendency to be formed porous. As a result of a porous formation, the oxygen atoms from the $O_2$ plasma used in the ashing technique may be diffused through the upper insulating layer 25 thus reaching and deteriorating the final upper magnetic layer pattern.

Accordingly, it is difficult to ensure process margins after the oxidation process and a subsequent ashing process required by this conventional technique. Embodiments of the invention address these and other limitations in the prior art.

SUMMARY OF THE INVENTION

An exemplary embodiment of the present invention provides an improved magnetic tunnel junction structure that results in a higher process margin resulting from the subsequent ashing process.

Another feature of the present disclosure provides an improved method of fabricating a magnetic tunnel junction structure that is less likely to result in a short between an upper magnetic layer and a lower magnetic layer.

A further feature of the present disclosure provides an improved method of fabricating a magnetic tunnel junction structure being capable of ensuring a temperature margin in an oxidation process for oxidizing an upper magnetic layer. In addition the oxidation process and the ashing process occur at approximately the same time.

In one embodiment, the present disclosure provides a magnetic tunnel junction structure having an oxidized buffer layer. The magnetic tunnel junction structure includes a lower electrode, and a lower magnetic layer pattern and a tunnel layer pattern sequentially stacked on the lower electrode, and an upper magnetic layer pattern, a buffer layer pattern, and an upper electrode, which are sequentially stacked on a portion of the tunnel layer pattern. The sidewall of the upper magnetic layer pattern is surrounded by an oxidized upper magnetic layer located on the tunnel layer pattern. In addition, the sidewall of the buffer layer pattern is surrounded by an oxidized buffer layer located on the oxidized upper magnetic layer.

The oxidized buffer layer prevents oxygen atoms from deteriorating the upper magnetic layer pattern during a subsequent process.

BRIEF DESCRIPTION OF THE DRAWINGS

The above and other features and advantages of the present disclosure will become more apparent to those of ordinary skill in the art by describing in detail preferred embodiments thereof with reference to the attached drawings in which.

DETAILED DESCRIPTION OF THE INVENTION

Figure 1:
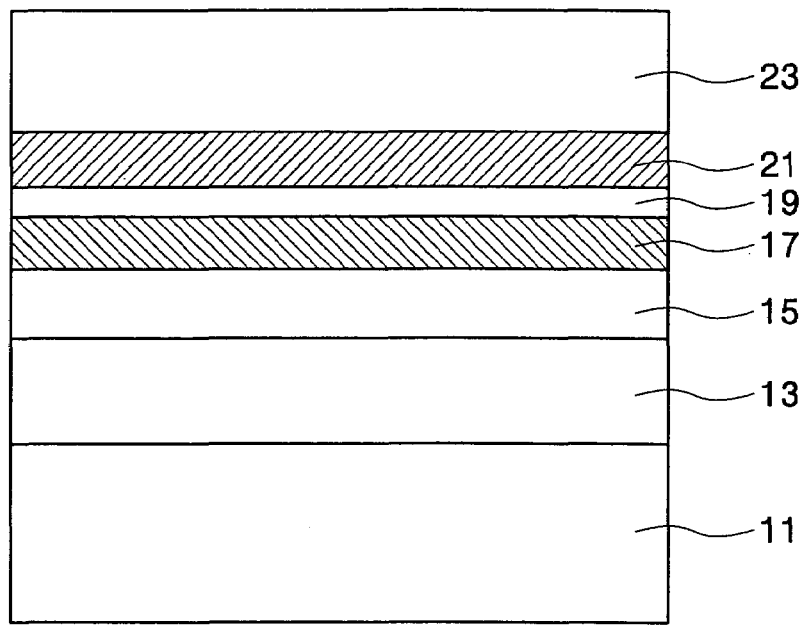
FIGS. 1 to 3 are cross-sectional views illustrating a conventional method of fabricating a magnetic tunnel junction structure.
Figure 2:
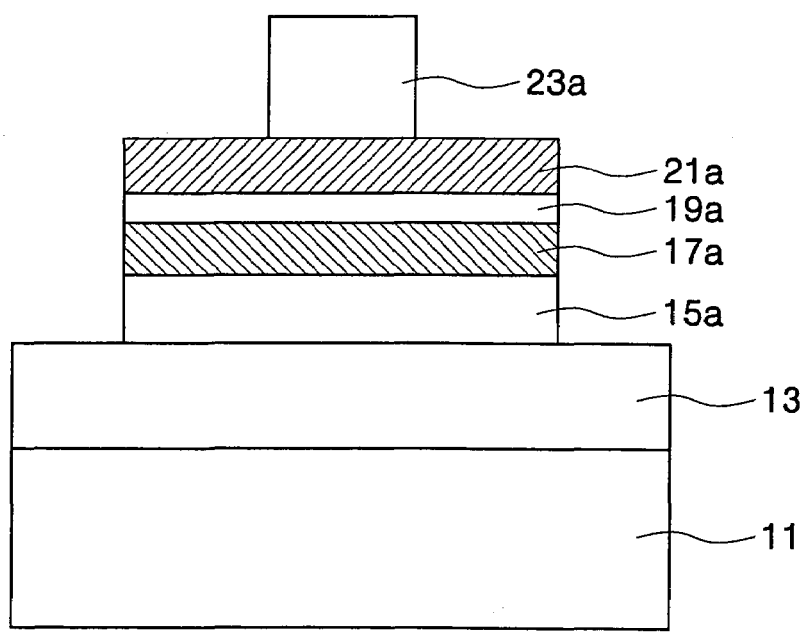
Figure 3:
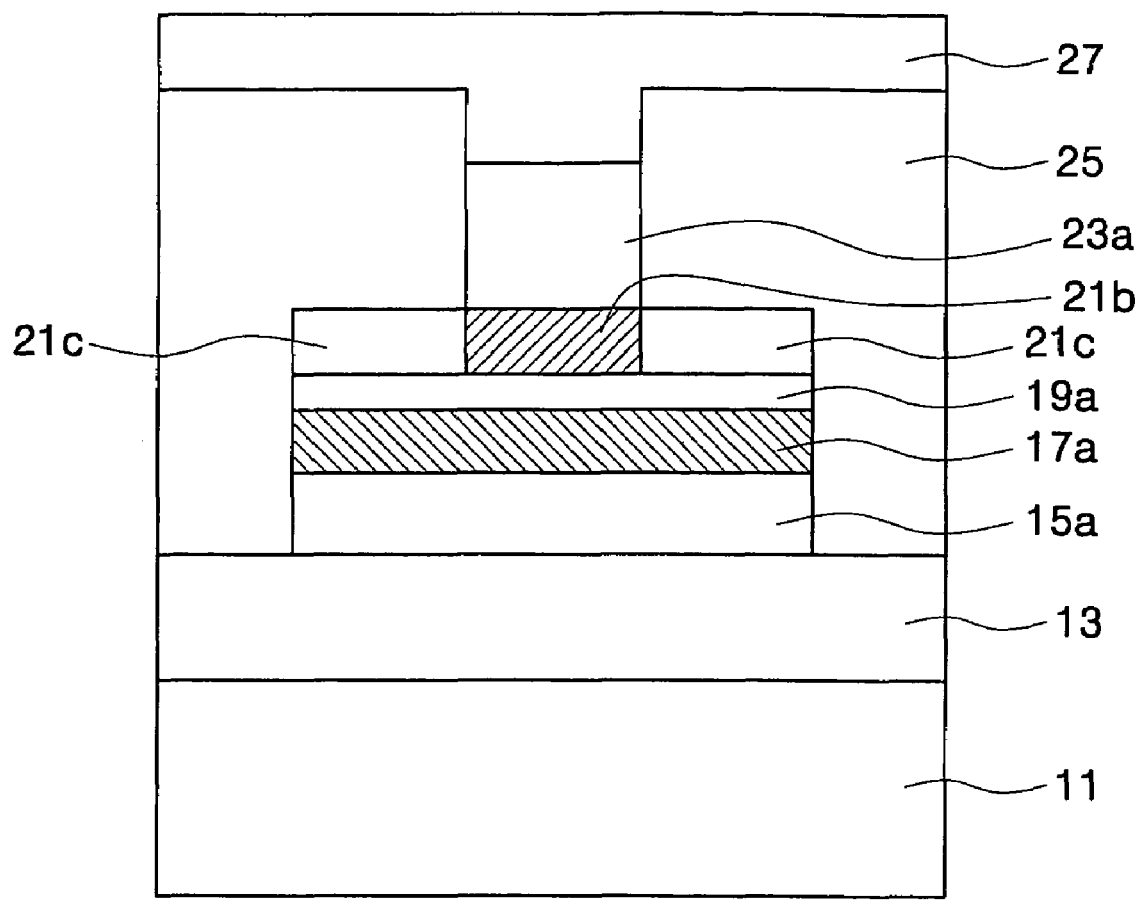

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIGS. 4 to 8 are cross-sectional views illustrating a method of fabricating a magnetic tunnel junction structure according to an embodiment of the present invention.

Figure 4:
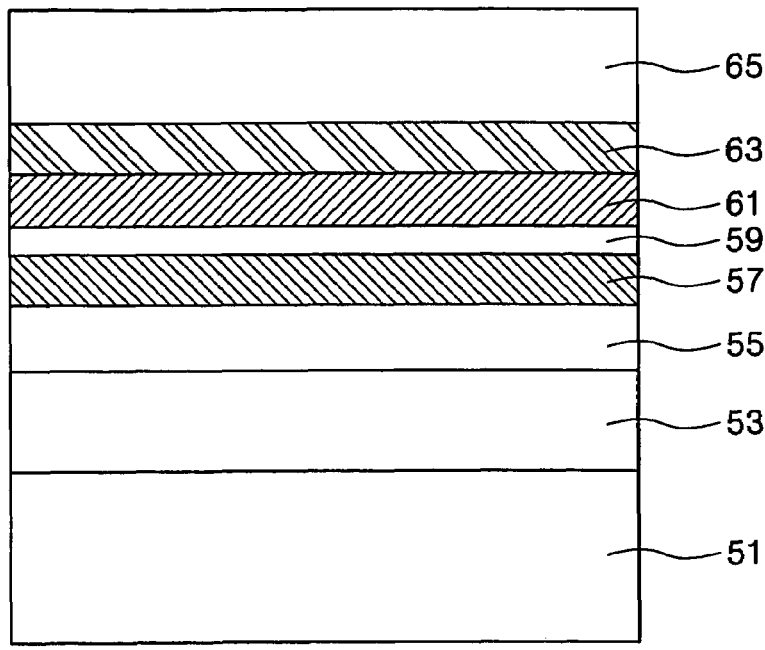
FIGS. 4 to 8 are cross-sectional views illustrating a method of fabricating a magnetic tunnel junction structure according to a preferred embodiment of the present invention.

Referring to FIG. 4, a lower insulating layer 53 is formed on a semiconductor substrate 51. The semiconductor substrate 51 has an access transistor (not shown). The access transistor includes a source region and a drain region, which are spaced apart by a channel region, and also includes a gate electrode located above the channel region. The gate electrode functions as a word line. A digit line (not shown) is located above the access transistor. The digit line may be aligned in parallel with the word line.

The lower insulating layer 53 is formed on the semiconductor substrate 51 having the digit line. Further, the lower insulating layer 53 has contact holes (not shown). The contact holes may be filled with contact plugs (not shown).

A lower conductive layer 55, a lower magnetic layer 57, a tunnel layer 59, an upper magnetic layer 61, a buffer layer 63, and an upper conductive layer 65 are sequentially formed on the lower insulating layer 53.

The lower conductive layer 55 is insulated from the digit line by the lower insulating layer 53, and is electrically connected to the drain region through the contact hole, for example, using the contact plug. The lower conductive layer 55 may be a laminate of layers including a titanium layer and a titanium nitride layer, or may be a platinum group metal layer, a conductive platinum group metal oxide layer, or a combination of layers including a platinum group metal layer and a conductive platinum group metal oxide layer. For example, the lower conductive layer 55 may include a platinum layer, a ruthenium layer, an iridium layer, a rhodium layer, an osmium layer, a palladium layer, or a combination of these layers. Also, the lower conductive layer 55 may include a platinum oxide layer, a ruthenium oxide layer, an iridium oxide layer, a rhodium oxide layer, an osmium oxide layer, a palladium oxide layer, or a combination of these layers.

The lower magnetic layer 57 includes a pinning layer and a pinned layer, which are sequentially stacked. Further, the lower magnetic layer 57 may include a seed layer for controlling the crystal orientation of the pinning layer.

The pinning layer may be formed of an anti-ferromagnetic layer such as an iridium manganese (IrMn) layer or a platinum manganese (PtMn) layer.

The pinned layer may be formed of a ferromagnetic layer such as a cobalt iron (CoFe) layer, a nickel iron (NiFe) layer or a ferro manganese (FeMn) layer. The magnetization direction of the pinned layer is determined by the pinning layer, and is fixed.

The tunnel layer 59 may be an insulating layer such as an aluminum oxide ($Al_2O_3$) layer. In the case of forming the tunnel layer 59 as an aluminum oxide layer, the tunnel layer 59 may be formed with a thickness ranging from approximately 15 to 30 Å.

The upper magnetic layer 61 may be formed of a ferromagnetic layer such as CoFe, NiFe, FeMn layers or a combination of these layers.

The buffer layer 63 can be formed of a conductive layer such as a tantalum (Ta) layer, a titanium (Ti) layer, or a titanium nitride (TiN) layer. The buffer layer 63 may function as a capping layer for preventing the formation of a native oxide layer on the upper magnetic layer 61. The buffer layer 63 may have a thickness of about 100 Å.

Figure 5:
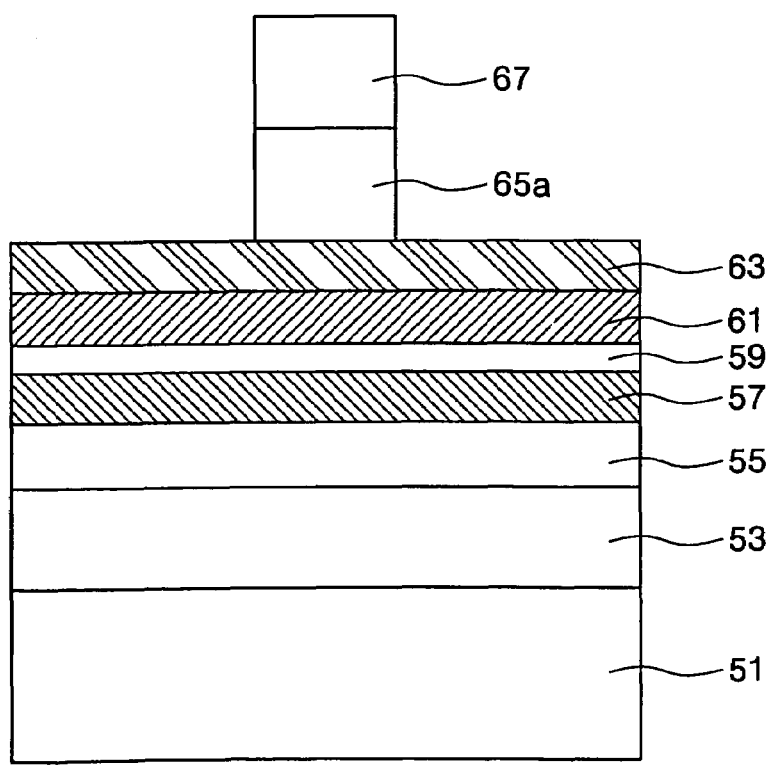

Referring to FIG. 5, a photoresist pattern 67 is formed on the upper conductive layer 65 to define a magnetic tunnel junction region. The magnetic tunnel junction region is located above the digit line.

The upper conductive layer 65 is etched using the photoresist pattern 67 as an etch mask to form an upper electrode 65a. In this case, the upper magnetic layer 61 should be prevented from being exposed by stopping the etching on the buffer layer 63. As a result, the upper electrode 65a is formed in the magnetic tunnel junction region, and around its ambient region. Also, a region of the buffer layer 63 is exposed.

Figure 6:
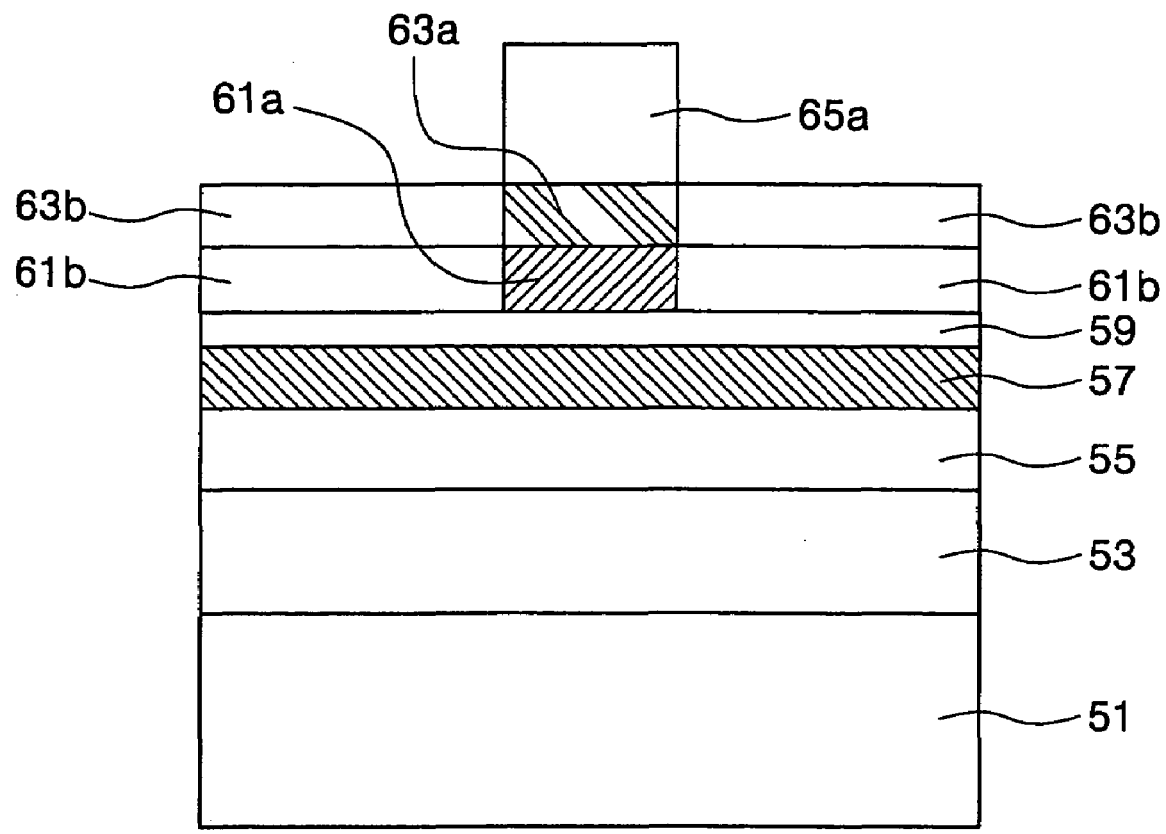

Referring to FIG. 6, the exposed buffer layer 63 is oxidized through an oxidation process. The upper magnetic layer 61 under the exposed buffer layer 63 is also oxidized together. The oxidation process may be performed by using an $O_2$ plasma gas at a temperature range of approximately 100 to 250° C., and preferably at a temperature of 200° C.

Since the oxidation process can be performed at a high temperature, the photoresist pattern 67 can be removed at approximately the same time through an ashing technique during the oxidation process.

The oxidation process results in an oxidized buffer layer 63b, and a buffer layer pattern 63a, the buffer layer pattern's sidewall surrounded by the oxidized buffer layer 63b. Under the oxidized buffer layer 63b, there is formed an oxidized upper magnetic layer 61b. Further, there is formed an upper magnetic layer pattern 61a surrounded by the oxidized upper magnetic layer 61b and located under the buffer layer pattern 63a.

Figure 7:
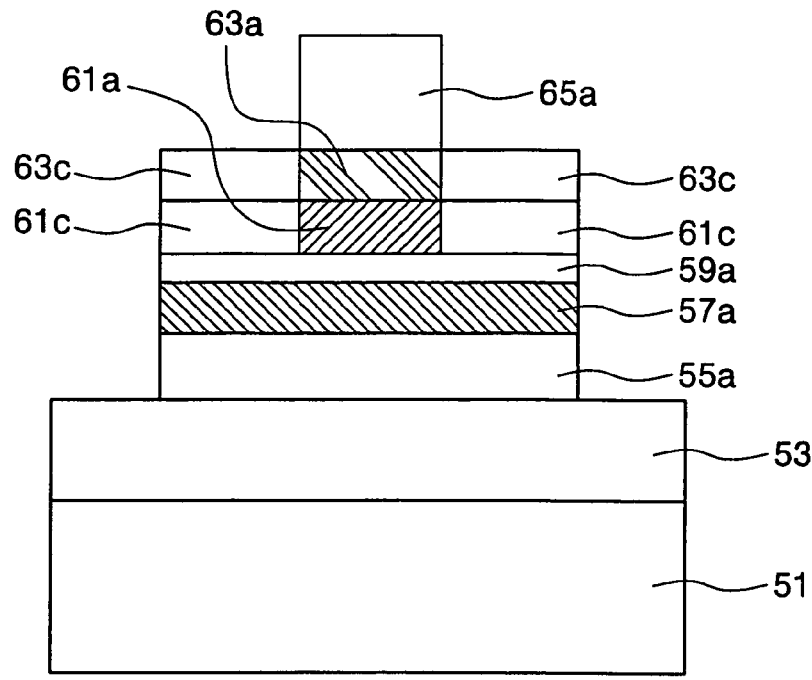

Referring to FIG. 7, after the buffer layer pattern 63a and the upper magnetic layer pattern 61a are formed, the oxidized buffer layer 63b, the oxidized upper magnetic layer 61b, the tunnel layer 59, the lower magnetic layer 57, and the lower conductive layer 55 are sequentially patterned. As a result, there are formed a lower electrode 55a, and a lower magnetic layer pattern 57a and a tunnel layer pattern 59a, which are sequentially stacked on the lower electrode 55a, and an oxidized upper magnetic layer pattern 61c and an oxidized buffer layer pattern 63c, which are sequentially stacked on the tunnel layer pattern 59a. The oxidized buffer layer pattern 63c surrounds the sidewall of the buffer layer pattern 63a, and the oxidized upper magnetic layer pattern 61c surrounds the sidewall of the upper magnetic layer pattern 61a.

The upper magnetic layer pattern 61a is protected by the oxidized buffer layer pattern 63c, the oxidized upper magnetic layer pattern 61c, and the buffer layer pattern 63a. Therefore, in the subsequent processes including the use of an ashing technique to remove a photoresist layer, the deterioration of the upper magnetic layer pattern 61a by oxygen atoms can be prevented.

Figure 8:
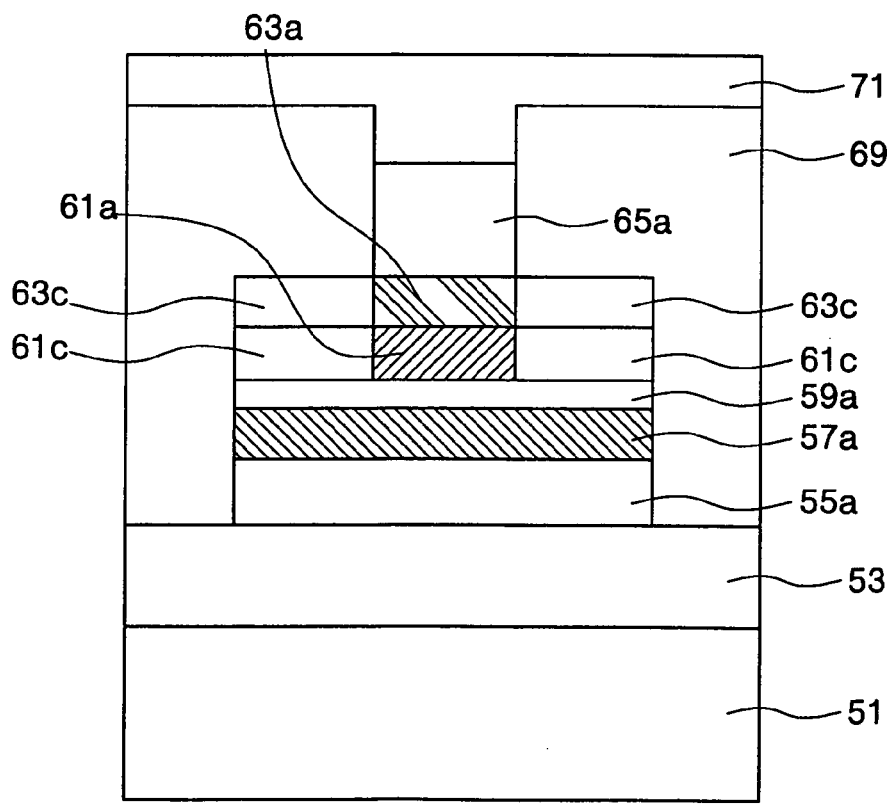

Referring to FIG. 8, an upper insulating layer 69 is formed on the semiconductor substrate having the lower electrode 55a formed thereon. The upper insulating layer 69 is formed through a low temperature process at a temperature of lower than 300° C. in order to prevent the deterioration of the lower magnetic layer pattern 57a and the upper magnetic layer pattern 61a.

The upper insulating layer 69 is then patterned to form a contact hole exposing the upper electrode 65a. Then, there is formed a bit line 71, which is electrically connected to the upper electrode 65a. The bit line 71 is aligned to cross over the digit line.

When a magnetic RAM cell operates in a write mode, a write current flows through the digit line and the bit line 71 to magnetize the upper magnetic layer pattern 61a. The magnetization direction aligned inside the upper magnetic layer pattern 61a during the write operation is determined by the direction of the write current flowing through the digit line and the bit line 71. The magnetization direction aligned inside the upper magnetic layer pattern 61a may be in parallel with, or in antiparallel with the magnetization direction maintained inside the lower magnetic layer pattern 57a.

When the magnetized spins inside the upper magnetic layer pattern 61a are aligned in parallel with fixed spins inside the lower magnetic layer pattern 57a, the tunnel layer pattern 59a shows the minimum magnetoresistance ($MR_{min}$). On the contrary, when the magnetized spins inside the upper magnetic layer pattern 61a are aligned in antiparallel with the fixed spins inside the lower magnetic layer pattern 57a, the tunnel layer pattern 59a shows the maximum magnetoresistance ($MR_{max}$).

When the magnetic RAM cell operates in a read mode, a sensing voltage is applied on the bit line 71, the source region is grounded, and a read voltage is applied on the word line so as to turn on the access transistor. In the case that the tunnel layer pattern 59a shows a low magnetoresistance depending on the magnetization direction of the upper magnetic layer pattern 61a, a large amount of current flows through the bit line 71. On the contrary, in the case that the tunnel layer pattern 59a shows a high magnetoresistance depending on the magnetization direction of the upper magnetic layer pattern 61a, a small amount of current flows through the bit line 71. As a result, the magnetization direction of the upper magnetic layer pattern 61a can be detected from the value of the current flowing through the bit line 71 under the applied sensing voltage.

EXAMPLES

The magnetoresistances of samples having the MTJ structure fabricated according to the embodiment of the present invention, as described above, in which a buffer layer was employed, and an oxidation process was performed after the buffer layer was exposed was recorded, as was the magnetoresistance of other samples having another MTJ structure fabricated by further etching the buffer layer, and exposing an upper magnetic layer, and performing an oxidation process. The measurement results are summarized as MR ratio (MRR) in Table 1. The buffer layer was formed of Ta with thickness of 100 Å, and the oxidation process was performed using an $O_2$ plasma gas at a temperature of 200° C. for one minute for all samples. Further, the exposed layers, buffer layer or upper magnetic layer, were overetched as shown in Table 1. The magnetoresistances were measured by applying an sensing voltage of 0.4 V. Here, the MRR can be given by Equation 1 as follows, by using Rmin of the tunnel layer pattern when the upper magnetic layer and the lower magnetic layer are in parallel with each other in their magneti zation directions, and $R_{max}$ of the tunnel layer pattern when they are in antiparallel with each other.

$$MRR=(R_{max}-R_{min})\times 100/R_{min} \quad \text{[Equation 1]}$$

With a greater difference between the $R_{max}$ and $R_{min}$, the MRR shows a higher value. A greater difference between the $R_{max}$ and $R_{min}$ is advantageous because it results in a greater difference in the current flowing through the tunnel layer pattern. Thus, it is more advantageous to sense the stored information when the MRR shows a higher value.

TABLE 1

| exposed layer | overetch | MRR |
|---|---|---|
| upper magnetic layer | 10% | 13% |
| | 20% | 11% |
| | 30% | 5% |
| buffer layer | 40% | 29% |
| (embodiment of the present invention) | 60% | 28% |
| | 80% | 29% |

As shown from the measurement results in Table 1, the MRRs of the samples according to the embodiment of the present invention, in each of which a buffer layer was exposed and an oxidation process was performed, were higher than that of the samples, in which an upper magnetic layer was exposed and an oxidation process was performed.

The samples with exposed upper magnetic layers showed considerably low values of MRR, and the values became lower as the over-etch was increased.

Further, as for the samples having the MTJ structure fabricated according to the embodiment of the present invention, their MRs were measured after an ashing process was additionally performed in order to confirm whether the upper magnetic layer pattern was deteriorated or not through a subsequent ashing process after the oxidation process was performed. The respective measurement results of the MR before and after the performance of the ashing process are shown in Table 2 as follows. The ashing process was performed using an $O_2$ gas, and was performed at a temperature of 110° C. for 40 minutes for the samples.

TABLE 2

| buffer layer overetch | MRR before additional ashing | MRR after additional ashing |
|---|---|---|
| 40% | 29% | 28% |
| 60% | 28% | 18% |
| 80% | 29% | 11% |

As shown in Table 2, in the sample having the buffer layer that was over-etched by 40% after its exposure, the MRRs had little difference before and after an additional ashing process. In contrast, in the sample having the buffer layer that was overetched by 60%, the MRR was considerably reduced after an additional ashing process was performed. The above reason is that the exposed buffer layer was oxidized to form an oxidized buffer layer by the oxidation process, and prevented oxygen atoms from going through into the upper magnetic layer pattern during the subsequent ashing process. However, if the thickness of the oxidized buffer layer was reduced, the oxygen atoms could not be properly prevented from penetrating through into the upper magnetic layer pattern. Therefore, it is assumed that the upper magnetic layer pattern was deteriorated during the subsequent ashing process, and MRR was reduced.

Accordingly, the present invention, performing the oxidation process after exposing the buffer layer, can prevent the deterioration of the upper magnetic layer pattern by the subsequent ashing process even with the 40% over-etch of the buffer layer.

According to the present invention, an upper magnetic layer pattern can be protected by a buffer layer pattern, an oxidized buffer layer, and an oxidized upper magnetic layer so that the deterioration of the upper magnetic layer pattern due to a subsequent ashing process is prevented. Therefore, a process margin for the subsequent ashing process can be secured. Further, according to the present invention, by performing an oxidation process for oxidizing an upper magnetic layer, a short between an upper magnetic layer and a lower magnetic layer can be prevented, and the deterioration of the upper magnetic layer even during a high temperature oxidation process can be prevented. Therefore, in the method of fabricating an MTJ structure according to the present invention, an oxidation process and an ashing process can be performed together.

Although the exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A method of fabricating a structure, the method comprising:
    forming an interlayer insulating layer on a semiconductor substrate;
    sequentially forming a lower conductive layer, a lower magnetic layer, a tunnel layer, an upper magnetic layer, a buffer layer and an upper conductive layer overlying the interlayer insulating layer;
    etching the upper conductive layer to form an upper electrode defining at least one magnetic tunnel region and exposing a portion of the buffer layer; and
    oxidizing the exposed buffer layer and the upper magnetic layer under the exposed buffer layer to form a buffer layer pattern surrounded by an oxidized buffer layer, and an upper magnetic layer pattern surrounded by an oxidized upper magnetic layer in the at least one magnetic tunnel region.

2. The method of claim 1, wherein a lower magnetic layer below the upper magnetic layer comprises a pinning layer and a pinned layer formed on the pinning layer.

3. The method of claim 1, wherein a tunnel layer between the lower magnetic layer and the upper magnetic layer is formed of Al2O3.

4. The method of claim 1, wherein the buffer layer is formed of at least one material layer selected from the group consisting of Ta, Ti, and TiN.

5. The method of claim 1, wherein oxidizing the exposed buffer layer and the upper magnetic layer tinder the exposed buffer layer together is performed using an oxygen plasma.

6. The method of claim 1, further comprising removing a photoresist pattern during oxidizing the exposed buffer layer and the upper magnetic layer under the exposed buffer layer.

7. The method of claim 1, further comprising, after formation of the upper magnetic layer pattern and the buffer layer pattern, sequentially patterning the oxidized buffer layer, the oxidized upper magnetic layer, a tunnel layer formed below the upper magnetic layer, a lower magnetic layer formed below the tunnel layer and a lower conductive layer formed below the lower magnetic layer to form a lower electrode, wherein the upper electrode is located on a portion of the lower electrode.

8. The method of claim 1, wherein the etching of the upper conductive layer stops on the buffer layer to prevent the upper magnetic layer from being exposed.

9. A method of fabricating a magnetic random access memory comprising:
forming an interlayer insulating layer on a semiconductor substrate;
sequentially forming a lower conductive layer, a lower magnetic layer, a tunnel layer, an upper magnetic layer, a buffer layer and an upper conductive layer overlying the interlayer insulating layer;
forming a photoresist pattern on the upper conductive layer to define at least one magnetic tunnel region;
etching the upper conductive layer using the photoresist pattern as an etch mask to form an upper electrode and to expose a portion of the buffer layer, wherein the etching of the upper conductive layer stops on the buffer layer to prevent the upper magnetic layer from being exposed; and
oxidizing the exposed buffer layer and the upper magnetic layer under the exposed buffer layer to form a buffer layer pattern surrounded by an oxidized buffer layer, and an upper magnetic layer pattern surrounded by an oxidized upper magnetic layer in the at least one magnetic tunnel region.

10. The method of claim 9, wherein oxidizing the exposed buffer layer and the upper magnetic layer under the exposed buffer layer together is performed using an oxygen plasma.

11. The method of claim 9, further comprising removing the photoresist pattern, during oxidizing the exposed buffer layer and the upper magnetic layer under the exposed buffer layer together.

12. The method of claim 9, further comprising, after formation of the upper magnetic layer pattern and the buffer layer pattern, sequentially patterning the oxidized buffer layer, the oxidized upper magnetic layer, the tunnel layer, the lower magnetic layer and the lower conductive layer to form a lower electrode, wherein the upper electrode is located on a portion of the lower electrode.

13. The method of claim 1, further comprises etching the upper conductive layer before oxidizing the exposed buffer layer and the upper magnetic layer.

14. The method of claim 1, wherein the buffer layer pattern is directly below the upper electrode.

15. The method of claim 14, wherein the buffer layer pattern and the oxidized buffer layer are disposed at a same first level.

16. The method of claim 15, wherein the upper magnetic layer pattern and the oxidized upper magnetic layer are disposed at a same second level.

* * * * *

UNITED STATES PATENT AND TRADEMARK OFFICE
CERTIFICATE OF CORRECTION

| | | |
|---|---|---|
| PATENT NO. | : 7,141,438 B2 | Page 1 of 1 |
| APPLICATION NO. | : 10/915872 | |
| DATED | : November 28, 2006 | |
| INVENTOR(S) | : Young-Ki Ha et al. | |

It is certified that error appears in the above-identified patent and that said Letters Patent is hereby corrected as shown below:

Column 8, line 57, the word "tinder" should read -- under --.

Signed and Sealed this

Twenty-sixth Day of August, 2008

JON W. DUDAS
*Director of the United States Patent and Trademark Office*